US010932073B2

United States Patent
Qin et al.

(10) Patent No.: US 10,932,073 B2
(45) Date of Patent: Feb. 23, 2021

(54) METHOD AND SYSTEM FOR MEASURING TOTAL SOUND PRESSURE LEVEL OF NOISE, AND COMPUTER READABLE STORAGE MEDIUM

(71) Applicant: AAC Technologies Pte. Ltd., Singapore (SG)

(72) Inventors: Yingming Qin, Shenzhen (CN); Zheng Xiang, Shenzhen (CN); Bing Xie, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 0 days.

(21) Appl. No.: 16/703,772

(22) Filed: Dec. 4, 2019

(65) Prior Publication Data
US 2020/0213794 A1 Jul. 2, 2020

(30) Foreign Application Priority Data

Dec. 31, 2018 (CN) .......................... 201811651147.1

(51) Int. Cl.
H04R 29/00 (2006.01)
G01R 31/28 (2006.01)
G06F 17/14 (2006.01)
G01H 11/06 (2006.01)

(52) U.S. Cl.
CPC ....... H04R 29/004 (2013.01); G01R 31/2825 (2013.01); G06F 17/14 (2013.01)

(58) Field of Classification Search
None
See application file for complete search history.

(56) References Cited

U.S. PATENT DOCUMENTS

| 2007/0086603 A1* | 4/2007 | Lyon ................. H04R 3/005 381/96 |
| 2010/0226501 A1* | 9/2010 | Christoph ........ G10L 21/0208 381/58 |
| 2012/0093344 A1* | 4/2012 | Sun ................... H04R 3/005 381/122 |
| 2018/0091900 A1* | 3/2018 | Parker ................ H04R 3/06 |
| 2018/0268802 A1* | 9/2018 | Urhonen ............ G10K 11/178 |

OTHER PUBLICATIONS

Waybackmachine version of "Sound Pressure," Wikipedia. Dec. 30, 2016. pp. 1-5.https://web.archive.org/web/20161230082506/https://en.wikipedia.org/wiki/Sound_pressure (Year: 2016).*
Davies, Don "RMS From Time History and FFT Spectrum." Jan. 6, 2015. pp. 1-4. http://blog.prosig.com/2015/01/06/rms-from-time-history-and-fft-spectrum/ (Year: 2015).*

* cited by examiner

*Primary Examiner* — Qin Zhu
(74) *Attorney, Agent, or Firm* — W&G Law Group LLP

(57) ABSTRACT

A method and a system for measuring a total sound pressure level of noise, and a computer readable storage medium are provided. The method includes: obtaining a time domain digital signal of a sound pressure signal of the noise; obtaining a frequency domain signal of the sound pressure signal according to the time domain digital signal of the sound pressure signal; obtaining a sound pressure effective value of the sound pressure signal based on the frequency domain signal and according to Parseval's theorem; and converting the sound pressure effective value into the total sound pressure level of the noise.

8 Claims, 3 Drawing Sheets

METHOD AND SYSTEM FOR MEASURING TOTAL SOUND PRESSURE LEVEL OF NOISE, AND COMPUTER READABLE STORAGE MEDIUM

TECHNICAL FIELD

The present disclosure relates to the field of acoustics, and in particular, to a method and a system for measuring a total sound pressure level of noise, and a computer readable storage medium.

BACKGROUND

With a development of electronic technologies, silent calling of a mobile communication terminal device such as a cellphone remind the user through a vibration of its body, and a component that generates a vibration is a built-in miniature linear vibration motor. Moreover, a core component of a small healthcare device such as a vibration massager is also equipped therein with a miniature linear vibration motor. A motor generates noise during operation, and the noise can also reflect an operation status of the motor in a degree.

A total sound pressure level is an important characteristic data of noise. In the related art, the total sound pressure level is usually measured by an octave accumulation method. However, inventors of the present disclosure have found that the octave accumulation method requires for filtering a noise signal before each accumulation, resulting in a large amount of calculation and a slow measurement speed.

BRIEF DESCRIPTION OF DRAWINGS

Many aspects of the exemplary embodiment can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DESCRIPTION OF EMBODIMENTS

In order to better illustrate the purpose, technical solutions and advantages of the present disclosure, the embodiments of the present disclosure will be described in details as follows with reference to the accompanying drawings. However, it should be understood by those skilled in the art that, technical details are set forth in the embodiments of the present disclosure so as to better illustrate the present disclosure. However, the technical solutions claimed in the present disclosure can be achieved without these technical details and various changes and modifications based on the following embodiments.

Figure 1:
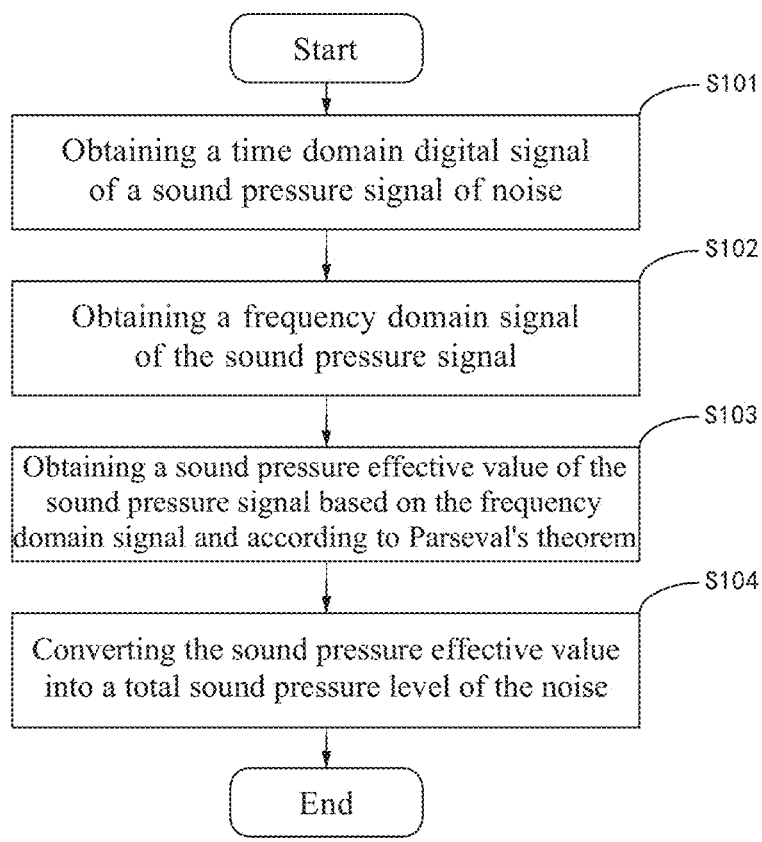
FIG. 1 is a flowchart of a method for measuring a total sound pressure level of noise according to a first embodiment.

A first embodiment of the present disclosure relates to a method for measuring a total sound pressure level of noise, and a process thereof is as shown in FIG. 1 and includes following steps.

In step S101, a time domain digital signal of a sound pressure signal of noise is obtained.

Optionally, in this step, the noise is collected by a microphone, and a voltage signal v[t] is outputted by the microphone; the voltage signal v[t] is inputted into a signal collection device that processes the voltage signal, and the signal collection device outputs a time domain digital signal v[n] of the voltage signal v[t]; a time domain digital signal Pa[n] of the sound pressure signal of the noise is calculated according to a sensitivity parameter sens of the microphone and the time domain digital signal v[n], and a calculation formula is as follows:

$$Pa[n] = \frac{v[n]}{sens}$$

Here, Pa[n] is the sound pressure signal of the noise, v[n] is the voltage signal of the noise, and sens is the sensitivity parameter of the microphone.

It should be understood that above-mentioned steps are merely illustrative of one implementation manner of this embodiment, and is not limited thereto.

In step S102, a frequency domain signal of the sound pressure signal is obtained.

Optionally, in this step, a frequency domain signal Pa[f] of the sound pressure signal can be obtained by a fast Fourier transform FFT of the time domain signal Pa[n], and the fast Fourier transform has a transform interval with a length N. It can be understood that there are various methods for time frequency transform, such as Fourier transform, etc., which will not be repeated herein.

In step S103, a sound pressure effective value of the sound pressure signal is obtained based on the frequency domain signal and according to Parseval's theorem.

Optionally, in this step, a quadratic sum $\Sigma_{n=0}^{N-1}|Pa[f]|^2$ of the frequency domain signal Pa[f] within the length N of the transform interval is calculated; and a sum of energy of the time domain digital signal of the sound pressure signal is obtained according to the quadratic sum $\Sigma_{n=0}^{N-1}|Pa[f]|^2$ and the length N of the transform interval, the sum of the energy being the sound pressure effective value of the sound pressure signal. A calculation formula is as follows:

$$E^2 = \frac{\sum_{n=0}^{N-1}|X[n]|^2}{N^2}$$

Here, E is the sum of the energy of the time domain digital signal of the sound pressure signal, X[n] is the frequency domain signal, and N is the length N of the transform interval. The calculation formula $$E^2 = \frac{2\sum_{n=0}^{N-1}|X[n]|^2}{N^2}$$

is verified, and steps thereof are as follows:

Let X[k] be a frequency domain signal corresponding to the time domain signal x[n], and X[k] and x[n] perform a time frequency transform through a EFT with N points. According to Parseval's theorem, energy of X[k] and energy of x[n] have a following relationship (consistent with energy conservation):

$$\sum_{k=0}^{N-1} |X[k]|^2 = N \sum_{n=0}^{N-1} |x[n]|^2$$

Thus, $$\frac{\sum_{n=0}^{N-1} |X[n]|^2}{N^2} = \frac{N \sum_{n=0}^{N-1} |x[n]|^2}{N^2} = \left( \sqrt{\frac{\sum_{n=0}^{N-1} |x[n]|^2}{N}} \right)^2 = \text{RMS}_{|x[n]|}^2$$

Here, X[k] being a frequency domain signal corresponding to the time domain signal x[n] and x[n] perform time frequency transform through a FFT with N points, and $\text{RMS}_{|x[n]|}$ is a root-mean-square of the time domain signal x[n] and is an effective value of the time domain signal x[n].

At this step, Pa[f] is X[k] in the formula, Pa[n] is x[n] in the formula, and E is the effective value $\text{RMS}_{|x[n]|}$.

After $E^2$ is obtained according to the frequency domain signal Pa[f], an effective value E of the sound pressure signal Pa[n] can be obtained by performing a square root of on $E^2$. Since Pa[n] is the sound pressure signal, E is the sound pressure effective value of the sound pressure signal Pa[n].

In step S104, the sound pressure effective value is converted into the total sound pressure level of the noise.

Optionally, in this step, the total sound pressure level corresponding to the sound pressure effective value E is obtained according to a transform formula between a sound pressure and a sound pressure level the transform formula being $$Lp = 20 \log_{10}\left(\frac{P}{P_0}\right),$$

where Lp is the sound pressure level, P is the sound pressure, and $P_0$ is a reference sound pressure being 20 µPa.

Compared with the related art, in the method for measuring the total sound pressure level of the noise provided by the first embodiment of the present disclosure, the time domain digital signal of the sound pressure signal of the noise is directly obtained; the frequency domain signal is obtained according to the time domain digital signal; and then the sound pressure effective value of the sound pressure signal can be directly obtained according to the frequency domain signal; and then the sound pressure effective value is converted into the total sound pressure level of the noise; and by performing the time frequency transform on obtained sound pressure signal of the noise, the effective value of the sound pressure signal, i.e., the sound pressure effective value, can be obtained according to a relationship between the time domain signal and the frequency domain signal revealed by Parseval's theorem; and the effective value of the sound pressure is converted to obtain the total sound pressure level of the noise. According to the relationship between energy of the time domain signal and energy of the frequency domain signal energy revealed by Parseval's theorem, the sound pressure effective value is obtained, and the total sound pressure level is obtained without filtering, which causes calculations thereof to be simple and a measuring speed to be fast.

Figure 3:
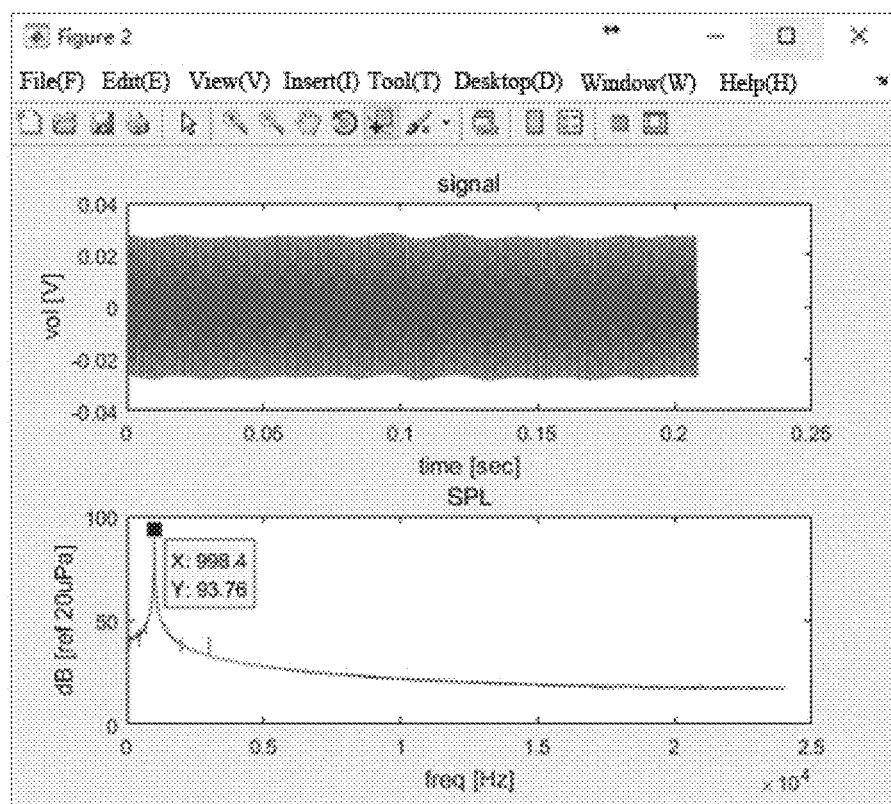
FIG. 3 is a schematic diagram of a time domain signal and frequency domain energy when verified using a standard sound signal (1 kHz) with a total sound pressure level being 94 dB.

Next, a standard sound signal (1 kHz) with the total sound pressure level being 94 dB is used for verification. With procedures described above, the energy of the time domain signal and the energy of the frequency domain energy are as shown in FIG. 3.

Figure 2:
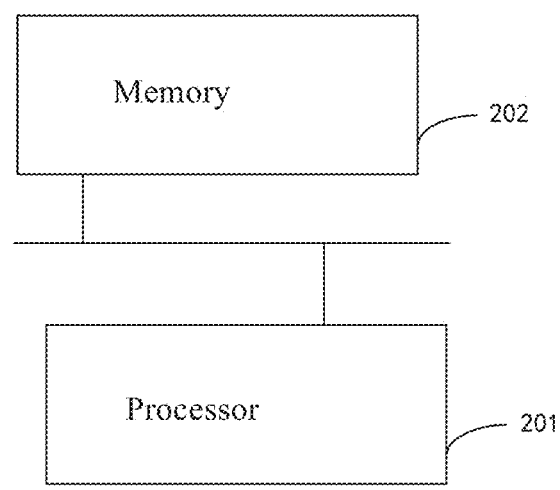
FIG. 2 is a schematic diagram of a system for measuring a total sound pressure level of noise according to a second embodiment.

As shown in FIG. 2, a second embodiment of the present disclosure relates to a system for measuring a total sound pressure level of noise, and the system includes at least one processor 201 and a memory 202 communicatively connected with the at least one processor 201. The memory 202 stores an instruction executable by the at least one processor 201, and the instruction, when executed by the at least one processor 201, causes the at least one processor 201 to perform the method for measuring the total sound pressure level of the noise described above.

The memory 202 and the processor 201 are connected through a bus, and the bus can include any number of interconnected buses and bridges. The bus connects various circuits of one or more processors 201 and the memory 202 together. The bus can also connect various other circuits such as peripherals, voltage regulators, and power management circuits, which are common knowledge in the related art and, therefore, will not be repeated herein. A bus interface provides an interface between the bus and a transceiver. The transceiver can be one element or multiple elements, such as multiple receivers and transmitters, providing units for communicating with various other devices on a transmission medium. Data processed by the processor 201 is transmitted in a wireless medium via an antenna. Optionally, the antenna can also receive data and transmit the data to the processor 201.

The processor 201 is configured to manage the bus and normal processing, and can also provide various functions including timing, peripheral interfaces, voltage regulation, power management, and other control functions. The memory 202 can be configured to store data used by the processor 201 when performing operations.

A third embodiment of the present disclosure relates to a computer readable storage medium storing a computer program, and the computer program is executed by a processor to perform the method as described above.

It should be understood by those skilled in the art that all or part of the steps of the above-mentioned embodiments can be implemented by a program instructing a related hardware. The program is stored in a storage medium, and includes multiple instructions causing a device (such as a microcontroller, a chip or the like) or processor execute all or part of steps of the method described in various embodiments of the present disclosure. The storage medium includes any medium that can store program codes, such as a USB flash disk, a mobile hard disk, a read-only memory (ROM), a random access memory (RAM), a diskette or an optical disk.

It should be understood by those skilled in the art that the above embodiments are merely some embodiments of the present disclosure, and various modifications in form and details can be made without departing from the scope of the present disclosure.

What is claimed is:

1. A method for measuring a total sound pressure level of noise, comprising steps of:
   obtaining a time domain digital signal of a sound pressure signal of the noise;

obtaining a frequency domain signal of the sound pressure signal according to the time domain digital signal of the sound pressure signal;

obtaining a sound pressure effective value of the sound pressure signal based on the frequency domain signal and according to Parseval's theorem; and converting the sound pressure effective value into the total sound pressure level of the noise;

wherein said obtaining a frequency domain signal of the sound pressure signal according to the time domain digital signal of the sound pressure signal comprises:

performing a fast Fourier transform on the time domain digital signal of the sound pressure signal to calculate the frequency domain signal of the sound pressure signal, wherein the fast Fourier transform has a transform interval with a length N;

wherein said obtaining a sound pressure effective value of the sound pressure signal based on the frequency domain signal and according to Parseval's theorem comprises:

calculating a quadratic sum of the frequency domain signal within the transform interval; and calculating a sum of energy of the time domain digital signal of the sound pressure signal according to the quadratic sum and the length N of the transform interval, wherein the sum of the energy is the sound pressure effective value of the sound pressure signal.

2. The method for measuring a total sound pressure level of noise as described in claim 1, wherein said obtaining a time domain digital signal of a sound pressure signal of the noise comprises:

collecting the noise and outputting a voltage signal, by a microphone;

processing, by a signal collection device, the voltage signal to obtain a time domain digital signal of the voltage signal; and calculating the time domain digital signal of the sound pressure signal of the noise according to the time domain digital signal of the voltage signal and a sensitivity parameter of the microphone.

3. The method for measuring a total sound pressure level of noise as described in claim 1, wherein said calculating a sum of the energy of the time domain digital signal of the sound pressure signal according to the quadratic sum and the length N of the transform interval comprises:

calculating a quadratic sum of the energy by a formula of $$E^2 = \frac{\sum_{n=0}^{N-1} |X[n]|^2}{N^2},$$

where E is the sum of the energy of the time domain digital signal of the sound pressure signal, X[n] is the frequency domain signal, and N is the length of the transform interval; and calculating a square root of a square of the sum of the energy to obtain the sum of the energy.

4. The method for measuring a total sound pressure level of noise as described in claim 1, wherein said converting the sound pressure effective value into a total sound pressure level of the noise comprises:

calculating the total sound pressure level of the noise according to the sound pressure effective value and a transform formula between a sound pressure and a sound pressure level, wherein the transform formula between the sound pressure and the sound pressure level is $$Lp = 20 \log_{10}\left(\frac{P}{P_0}\right),$$

where Lp is the sound pressure level, P is the sound pressure, and $P_0$ is a reference sound pressure being 20 µPa.

5. A system for measuring a total sound pressure level of noise, comprising:

at least one processor; and, a memory communicatively connected with the at least one processor;

wherein the memory stores an instruction executable by the at least one processor, the instruction, when executed by the at least one processor, causing the at least one processor to execute the method for measuring the total sound pressure level of the noise as described in claim 1.

6. A system for measuring a total sound pressure level of noise, comprising:

at least one processor; and, a memory communicatively connected with the at least one processor;

wherein the memory stores an instruction executable by the at least one processor, the instruction, when executed by the at least one processor, causing the at least one processor to execute the method for measuring the total sound pressure level of the noise as described in claim 2.

7. A system for measuring a total sound pressure level of noise, comprising:

at least one processor; and, a memory communicatively connected with the at least one processor;

wherein the memory stores an instruction executable by the at least one processor, the instruction, when executed by the at least one processor, causing the at least one processor to execute the method for measuring the total sound pressure level of the noise as described in claim 3.

8. A system for measuring a total sound pressure level of noise, comprising:

at least one processor; and, a memory communicatively connected with the at least one processor;

wherein the memory stores an instruction executable by the at least one processor, the instruction, when executed by the at least one processor, causing the at least one processor to execute the method for measuring the total sound pressure level of the noise as described in claim 4.

* * * * *